US009806595B2

United States Patent
Geyer et al.

(10) Patent No.: US 9,806,595 B2
(45) Date of Patent: Oct. 31, 2017

(54) FAST MODEL PREDICTIVE PULSE PATTERN CONTROL

(71) Applicant: ABB Technology AG, Zurich (CH)

(72) Inventors: Tobias Geyer, Zurich (CH); Nikolaos Oikonomou, Bern (CH); Georgios Papafotiou, Allenwinden (CH)

(73) Assignee: ABB Schweiz AG (CH)

( * ) Notice: Subject to any disclaimer, the term of this patent is extended or adjusted under 35 U.S.C. 154(b) by 0 days.

(21) Appl. No.: 15/169,336

(22) Filed: May 31, 2016

(65) Prior Publication Data

US 2016/0276919 A1 Sep. 22, 2016

Related U.S. Application Data

(63) Continuation of application No. PCT/EP2014/073366, filed on Oct. 30, 2014.

(30) Foreign Application Priority Data

Nov. 29, 2013 (EP) .................................... 13195171

(51) Int. Cl.
*H02M 1/08* (2006.01)
*H03K 5/08* (2006.01)
(Continued)

(52) U.S. Cl.
CPC ................ *H02M 1/08* (2013.01); *H03K 5/08* (2013.01); *H02M 7/04* (2013.01); *H02M 7/44* (2013.01); *H02M 7/539* (2013.01)

(58) Field of Classification Search
CPC ................................. H02M 1/08; H03K 5/08
See application file for complete search history.

(56) References Cited

U.S. PATENT DOCUMENTS 4,970,373 A * 11/1990 Lutz ...................... F24H 9/2028
                                                        219/492
5,399,955 A *  3/1995 Glaser ...................... G05F 1/70
                                                        323/208
(Continued)

FOREIGN PATENT DOCUMENTS

EP          1717941 A2      11/2006
EP          2469692 A1       6/2012

OTHER PUBLICATIONS

Keng-Yuan Chen, Jwu-Sheng Hu, Chi-Him Tang, Te-Yang Shen, "A novel switching strategy for FOC motor drive using multi-dimensional feedback quantization," Control Engineering Practice, vol. 20, Issue 2, Feb. 2012, pp. 196-204, ISSN 0967-0661, http://doi.org/10.1016/j.conengprac.2011.10.013.*

(Continued)

*Primary Examiner* — Harry Behm
*Assistant Examiner* — Peter Novak
(74) *Attorney, Agent, or Firm* — Taft Stettinius & Hollister LLP

(57) ABSTRACT

A method for controlling an electrical converter comprises the acts of determining an error value based on a difference between an estimated output value and a reference output value, the estimated output value being based on measurements in the electrical converter; comparing the error value with an error band and in the case of the error value exceeds the error band, controlling the electrical converter by switching to a different control scheme. The converter is controlled with the modified pre-calculated switching by determining a pre-calculated switching sequence for the converter based on an actual state of the electrical converter, the switching sequence comprising a sequence of switching transitions of the converter; modifying the pre-calculated switching sequence by modifying transition times of switching transitions of the pre-calculated switching sequence, such that (Continued)

the error value is minimized; and applying at least a part of the modified switching sequence to the electrical converter.

19 Claims, 4 Drawing Sheets

(51) Int. Cl.
*H02M 7/539* (2006.01)
*H02M 7/04* (2006.01)
*H02M 7/44* (2006.01)

(56) References Cited

U.S. PATENT DOCUMENTS

| 6,828,765 B1* | 12/2004 | Schultz | H02M 3/157 323/284 |
|---|---|---|---|
| 2012/0120687 A1* | 5/2012 | Ohsaki | B23K 9/067 363/21.09 |

OTHER PUBLICATIONS

Hao Ma and Tao Zhang, "Analysis and design for sliding mode controlled buck inverter based on reference sliding surface and state variables surface," Twenty-First Annual IEEE Applied Power Electronics Conference and Exposition, 2006. APEC '06., Dallas, TX, 2006, pp. 1472-1477.*

J. Huang, A. Zhang, X. Chen, H. Zhang and J. Wang, "A novel direct power control strategy of double hysteresis and multiple switching tables for rectifiers," 2011 International Conference on Advanced Power System Automation and Protection, Beijing, 2011, pp. 36-41.*

Geyer, Model Predictive Pulse Pattern Control. IEEE Transactions on Industry Applications, IEEE Service Center, Piscataway, NJ vol. 48, No. 2, Mar. 1, 2012, pp. 663-676.

Kail, et al. Improved dynamic operation for direct flux control of active front ends with low switching frequency, Power Electronics Specialist Conference, 2004, PESC 04, 2004 IEEE 35th Annual, AACHEN, Germany, Jun. 20-25, 2004, Piscataway, NJ, pp. 3533-3539.

Kulka, et al. Direct torque controlling technique with synchronous optimized pulse patter, Proceedings of the Annual Power Electronics Specialists Conference, Seattle, Jun. 20-25, 1993; IEEE, US, vol. Conf. 24, Jun. 20, 1993, pp. 245-250.

European Search Report, EP13195171.7, ABB Technology AG, May 9, 2014, 9 pages.

International Search Report and Written Opinion, PCT/EP2014/073366, ABB Technology AG, Feb. 6, 2015.

\* cited by examiner

FAST MODEL PREDICTIVE PULSE PATTERN CONTROL

FIELD OF THE INVENTION

The invention relates to the field of high power electronics. In particular, the invention relates to a method, a computer program, a computer-readable medium and a controller for controlling an electrical converter as well as to an electrical converter.

BACKGROUND OF THE INVENTION

Offline computed and optimized pulse patterns may be used for modulating the semiconductor switches in an electrical converter. Based on the actual speed and flux reference (provided for example by an outer control loop), a controller may determine a best suited offline computed pulse pattern, which is then applied to the semiconductor switches of the electrical converter. Offline computed optimized pulse patterns allow the minimization of the overall current distortion for a given switching frequency.

When the electrical converter is used for driving an electrical machine, the current distortion is proportional to the harmonic losses in the stator winding of the electrical machine, while the switching frequency relates to the switching losses of the power inverter. In a grid-connected converter setting, stringent standards may be imposed on the voltage and current distortions a converter may inject into the grid. Traditionally, it has only been possible to use optimized pulse patterns in a modulator driven by a very slow control loop. This may lead to very long transients and to harmonic excursions of the currents when changing the operating point.

In EP 2 469 692 A1, a control method is proposed that combines the merits of direct torque control and optimized pulse patterns, by manipulating in real time the switching instants of the pre-computed optimized pulse patterns, no as to achieve fast closed-loop control. This so-called model predictive pulse pattern controller ($MP^3C$) may address in a unified approach the tasks of the inner current control loop and modulator. $MP^3C$ may control a flux vector, which, in case of an electrical converter driving an electrical machine, is typically the stator flux linkage vector of the electrical machine. For grid-connected converters, the virtual converter flux may constitute the flux vector.

$MP^3C$ achieves short response times during transients, and a good rejection of disturbances. At steady-state operating conditions, due to the usage of optimized pulse patterns, a nearly optimal ratio of harmonic current distortions per switching frequency is obtained. Compared to state of the art trajectory controllers, $MP^3C$ may provide two advantages. First, a complicated observer structure to reconstruct the fundamental quantities may not be required. Instead, the flux space vector, which may be the controlled variable, may be estimated directly by sampling the currents and the DC-link voltage at regular sampling intervals. Second, by formulating an optimal control problem and using a receding horizon policy, the sensitivity to flux observer noise may be greatly reduced.

During transient operation, such as reference step or ramp changes, large disturbances and faults, the controlled variables, such as currents, electromagnetic torque and flux linkage, are typically required to change in a step-like fashion or they must follow a steep ramp. Examples include fast torque steps in high performance drives and power steps in low-voltage ride through operation.

In $MP^3C$, closed-loop control is achieved by modifying the switching instants of the optimized pulse patterns' switching transitions in real time. More specifically, the switching transitions are modified in time, such that the flux error is removed at a future time instant. Note that in an optimized pulse patterns, the switching transitions are not evenly distributed in time. At very low switching frequencies, long time intervals may arise between two switching transitions. When a reference step is applied at the beginning of such a time interval, a significant amount of time may elapse before the controlled variables start to change, resulting in a long initial time delay and also prolonging the settling time.

Once the controlled variable has started to change, the transient response may be sluggish and significantly slower than when using deadbeat control or direct torque control, for example. The sluggish response is typically due to the absence of a suitable voltage vector that moves the controlled flux vector with the maximum speed and in the direction that ensures the fastest possible compensation of the torque or current error. In order to ensure a very fast transient response during a transient, at least one phase may need to be connected to the upper or lower DC-link rail of the converter. In a low-voltage ride through setting, for example, this may imply reversing the voltage in at least one phase from its maximal to its minimal value, or vice versa, during a major part of the transient.

Directly related to the behaviour of sluggish transient responses is the issue of current excursions during transients. Such excursions may occur when the switching transitions, which are to be shifted in time so as to remove the flux error, are spread over a long time interval. This may increase the risk that the flux vector is not moved along the shortest path from its current to its new desired position. Instead, the flux vector may temporarily deviate from this path, exceeding its nominal magnitude. This may be equivalent to a large current, which may result in an over-current trip.

Related issues may also arise at quasi steady-state operating conditions, where small variations in the operating point and/or the inverter voltages occur. Specifically, fluctuations in the DC-link voltage, resistive voltage drops in the machine's stator windings or in the grid impedance and transitions between different pulse patterns may lead to a degradation of the closed-loop performance of $MP^3C$, if they are not properly accounted for.

Particularly in cases, where the optimized pulse patterns' switching transitions exhibit an uneven distribution in time and when a very low switching frequency is used, these flux errors may not be accounted for in a timely fashion due to the absence of suitable switching transitions. As a result, large flux errors may arise that build up and persist over significant periods of time, leading to a poor tracking of the optimized pulse pattern's optimal flux trajectory. This may impact the total harmonic distortion of the current in a detrimental way.

In "Direct torque controlling technique with synchronous optimized pulse pattern", proceedings of the annual power electronics specialists conference. (pesc) Seattle, june 20-25, 1993; proceedings of the annual power electronics specialists conference (pesc), new York, IEEE, US, vol. Conf. 24, 20 Jun. 1993(1993-06-20) pages 245-250, XP010149065, DOI: 10.1109/PESC. 1993.471952 ISBN: 987-0-7803-1243-2, a generic method for direct torque control using synchronous optimized pulse pattern is disclosed.

Furthermore, "Model Predictive Pulse Pattern Control", IEEE Transactions on Industry Applications IEEE Service Center, Piscataway, N.J., US, vol 48, no 2, 1 Mar. 2012 pages 663-676, XP011434186, ISSN: 0093.9994, DOI: 10.1109/TIA.2011.2181289 shows method for model predictive pulse pattern control that combines the optimal steady-state performance of optimized pulse patterns with the very fast dynamics of trajectory tracking control.

Moreover, in "Improved dynamic operation for direct flux control of active front ends with low switching frequency", Power Electronics Specialists Conference, 2004. Pesc 04. 2004 IEEE 35th Annual Aachen, Germany 20-25 Jun. 2004, Piscataway, N.J., USA IEEE, US 20 Jun. 2004, 'pages 3533-3539, XP010739481, ISBN: 987-0-7803-8399-9, a three-fold pulse pattern for direct flux control of a high-power multilevel active front ends (AFE) with low switching-frequency useful for reducing the harmonic content within the converter terminal voltage is mentioned.

Additionally, EP 1 717 941 A2 discloses a method for controlling a voltage source converter comprising a plurality of valves, each containing a plurality of extinguishable semiconducting elements in a high power application, wherein an executing pulse width modulation signal is provided for controlling the voltage source converter. The method comprises the following steps:

controlling the voltage source converter during a first period of time wherein the executing signal comprises a first pulse-width modulation signal, and controlling the voltage source converter during a second period of time, and following the first period of time, wherein the executing signal comprises a second pulse-width modulation signal.

DESCRIPTION OF THE INVENTION

It is an object of the invention to overcome the above-mentioned problems.

This object is achieved by the subject-matter of the independent claims. Further exemplary embodiments are evident from the dependent claims and the following description.

An aspect of the invention relates to a method for controlling an electrical converter. The electrical converter may be an inverter or an active rectifier. It may be an indirect or a direct converter. In particular, the converter may be a high power converter adapted for converting current with more than 100 A and/or 1000 V.

According to an embodiment of the invention, the method comprises the steps of: determining an error value based on a difference between an estimated output value and a reference output value, the estimated output value being based on measurements from the electrical converter; comparing the error value with an error band and in the case of the error value being within the error band, controlling the electrical converter with a modified pre-calculated switching sequence, for example with the above-mentioned MP$^3$C method, in which pre-calculated optimized pulse patterns are modified by modifying the time-instants of switching transitions.

In the case when the error value exceeds the error band (i.e. is outside the error band), the electrical converter is controlled by switching to a different control scheme.

For example, the electrical converter is controlled by: determining a pre-calculated switching sequence (which may be determined offline and/or which may be fetched from a table of pre-calculated switching sequences) for the converter based on an actual state of the electrical converter, the switching sequence comprising a sequence of switching transitions of the converter; modifying the pre-calculated switching sequence by modifying or moving transition times of switching transitions of the pre-calculated switching sequence such that the flux error is minimized; and applying at least a part of the modified switching sequence ((for example the first switching transitions of the modified switching sequence) to the electrical converter. The pre-calculated switching sequences may be based on an optimized pulse pattern.

In other words, during a normal operation mode, a conventional MP$^3$C method may be performed. Whenever the determined error value exceeds a pre-defined error band, the method switches to a dynamic operation mode (i.e. to a different control scheme), which is better adapted for dealing with dynamic conditions.

For example, the error value may be a flux error based on a difference between an estimated flux vector and a reference flux vector, and/or the error value may be a current error based on a difference between an estimated current and a reference current.

The method may ensure a high performance both at quasi steady-state as well as at dynamic operating conditions.

At quasi steady-state operation (in the normal operation mode), optimized pulse pattern operated with MP$^3$C may produce currents at the terminals of the electrical converter of minimum harmonic distortion. More specifically, strict industrial standards demanding very low current THDs (total harmonic distortion) in power electronic inverter systems may be fulfilled. Similarly, stringent grid code regulations that demand very low total harmonic distortion and/or the elimination of specific harmonic components may be fulfilled in active rectifier systems.

For an electrical converter operated in dynamic conditions (in the dynamic operation mode), the different control scheme may allow the fast elimination of large control errors. For machine-side inverters, this may amount to fast torque and speed control of the controlled electrical machine. In active rectifier systems, the benefit may be a fast rejection of grid voltage imbalances that may occur during operation and the fast control of the active and reactive power of the system, or of the corresponding currents. Such requirements may be typically imposed in special purpose power converters, e.g. in hot rolling steel mills, traction and marine applications.

The control scheme, which is applied during the dynamic operation mode, may be a completely different control method. When the error exceeds a pre-defined error band (during reference steps and/or large transients), the method may change over to a very fast controller.

According to an embodiment of the invention, the different control scheme is another control method. For example, the other control method may be a hysteresis-based control method, such as direct torque control, direct self control, model predictive direct torque control and sliding mode control. Direct torque control and direct self control may be defined via U.S. Pat. No. 4,678,248. Direct torque control and direct self control may differ in the path along which the flux vector is controlled. The path of direct torque control may be quasi circular whereas the path of direct self control may be hexagonal. Model predictive direct torque control and its derivatives, which include model predictive direct current control, model predictive direct power control and model predictive direct balancing control, may be defined via EP 1 670 135, U.S. Pat. No. 7,256,561, U.S. Pat. No. 8,004,227 and EP 2 348 631.

Alternatively or additionally, the different control scheme may be based on MP³C, for example by insertion of one or more additional switching transitions when the error exceeds the pre-defined error band.

According to the invention, the different control scheme is based on inserting additional switching transitions into the pre-calculated switching sequence before the pre-calculated switching sequence is modified. It has to be understood that additional switching transitions may form an additional pulse in the switching sequence, i.e. may comprise a switching transition from 0 to a specific voltage level and a transition from the specific voltage level back to 0. For example, this additional pulse (or the additional switching transition) may be inserted before all other switching transitions of the pre-calculated switching sequence. The additional switching transition generate an additional pulse with an infinitesimal small width, in particular close to zero or zero. In principle, such a pulse does not change the characteristics of the pre-calculated switching sequence (such as generated flux or volt seconds, etc.). However, due to the movement of the switching transitions for minimizing the error value, the additional pulse may become a pulse of nonzero width, which will then contribute to minimizing the error. Because a switching sequence with an additional pulse has more degrees of freedom than the original one, the error value may be compensated much faster than with the original one.

The step of comparing the error value with an error band may be based on determining whether the error value lies within or outside of an error band (between a minimal and a maximal threshold value). In the case of inserting an additional switching transition, the type of the inserted switching transition (and/or inserted pulse) may be based on the magnitude of the error value. Also this may be determined from the position of the error value in further error bands.

Furthermore, an error band associated with the error value is selected from a plurality of error bands, and a voltage level of the inserted pulse is dependent on the determined error band. For example, when the error lies within a first (central error band), no additional transition is inserted. When the error lies within a second error band (neighbouring the first error band), an additional switching transition relating to a first, basic voltage level is inserted. When the error lies within a third error band (neighbouring the second error band), an additional switching transition relating to a second voltage level (higher than the first voltage level) is inserted.

According to an embodiment of the invention, the error bands have different widths. For example, the above-mentioned central error band may be wider than the first and/or second error band.

According to the invention, a selection of an error band is based on past error values. For example, when the error values are becoming bigger over time, higher pulses may be inserted as when the error values are becoming smaller. Also the error bands may be defined with a hysteresis with respect to the time behaviour of the error value.

According to an embodiment of the invention, the modified switching sequence is determined by solving a quadratic program (QP) with a cost function based on the error value. It has to be understood that the optimization step of the MP³C method may be performed by solving a quadratic program subjected to constraints. For example, the cost function associated with the quadratic program may be based on a difference between the error value and a corrective value, which is a function of the modified switching sequence, over a horizon of (for example) more than two time steps.

According to an embodiment of the invention, the error value is minimized subject to the constraint that an order of switching transitions of the pre-calculated switching sequence is not modified. In particular, the order of the switching transitions in the pre-calculated switching sequence may be a constraint in the quadratic program.

According to an embodiment of the invention, the error value is minimized within a prediction horizon that encompasses at least two switching transitions in two phases. It may also be possible that the length of the horizon depends on the determined pre-calculated switching sequence.

A further aspect of the invention relates to a computer program, which when being executed on a processor, is adapted for executing the steps of the method as described in the above and in the following, and to a computer-readable medium on which such a computer-program is stored. A computer-readable medium may be a floppy disk, a hard disk, an USB (Universal Serial Bus) storage device, a RAM (Random Access Memory), a ROM (Read Only Memory), and an EPROM (Erasable Programmable Read Only Memory). A computer-readable medium may also be a data communication network, e.g. the Internet, which allows downloading a program code.

A further aspect of the invention relates to a controller for controlling an electrical converter adapted for executing the steps of the method as described in the above and in the following. For example, the control method may be implemented on any computational hardware including DSPs, FPGAs, microcontrollers, CPUs, GPUs, multi-core platforms, and combinations thereof. In particular, the controller may comprise a memory in which the above-mentioned computer program is stored and may comprise a processor for executing the computer program.

A further aspect of the invention relates to an electrical converter. The converter may be any multi-level power converter, such as a two-level converter, a three-level converter, a neutral point clamped three-level converter, a flying-capacitor four-level converter, a five-level converter, a cascaded H-bridge five-level converter, a modular multi-level converter, etc.

According to an embodiment of the invention, the electrical converter comprises a plurality of semiconductor switches, and a controller as described in the above and in the following for controlling the semiconductor switches of the electrical converter.

The electrical converter may be used on the machine side and/or on the grid side.

For example, in the machine side case, the controller may control the electrical machine's stator flux vector along a pre-defined and optimal trajectory. An LC filter and/or along cable may be present between the electrical converter and the electrical machine. The controlled variables may comprise the electromagnetic torque and/or the magnitudes of the stator and rotor flux vectors.

In the grid side case, the electrically converter may be connected via an LC filter and/or a transformer to the grid. The electrical converter's virtual flux vector may be controlled along a given trajectory by manipulating the converter switches. The controlled variables may comprise the real and/or the reactive power and/or the converter currents and/or the virtual converter flux.

It has to be understood that features of the method as described in the above and in the following may be features of the computer program, the computer-readable medium, the controller, and/or the electrical converter as described in the above and in the following.

These and other aspects of the invention will be apparent from and elucidated with reference to the embodiments described hereinafter.

BRIEF DESCRIPTION OF THE DRAWINGS

The subject-matter of the invention will be explained in more detail in the following text, with reference to exemplary embodiments which are illustrated in the attached drawings.

The reference symbols used in the drawings and their meanings are listed in the summary form in the list of reference symbols. In principle, identical parts are provided with the same reference symbols in the figures.

DETAILED DESCRIPTION OF EXEMPLARY EMBODIMENTS

Controller

Figure 1:
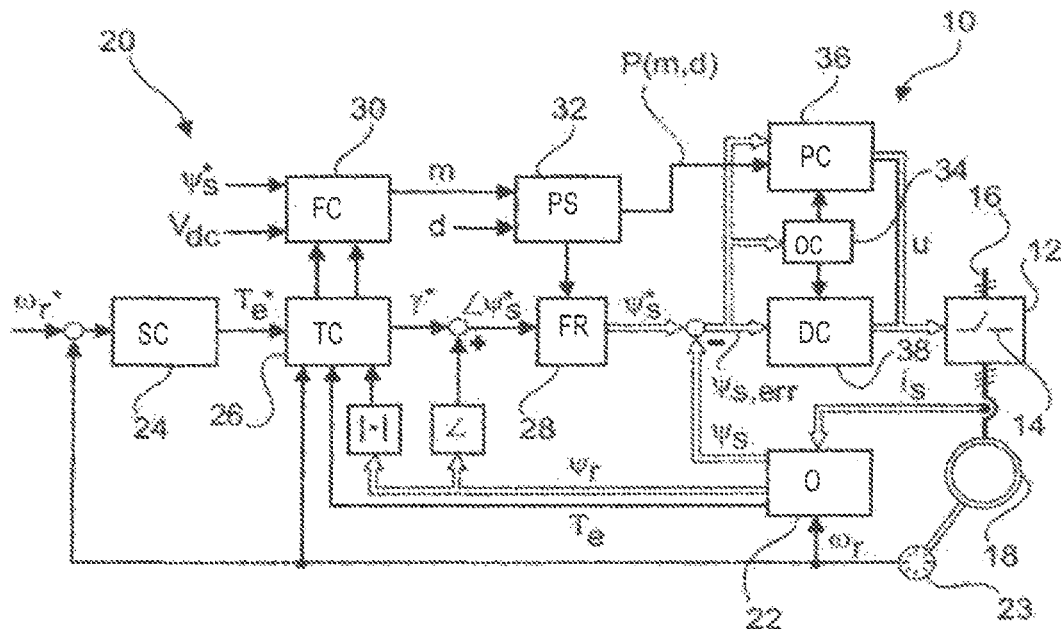
FIG. 1 schematically shows an electrical system with a converter according to an embodiment of the invention. The different control loops are also shown.

FIG. 1 shows an electrical system 10 comprising an electrical converter 12 with semiconductor switches 14 (only indicated as a simple switch) that interconnects a DC link 16 with an electrical motor 18. The electrical converter is controlled by a controller 20 that is adapted to perform the MP³C method in a normal operation mode and to switch to another control scheme, such as a faster control method and/or to MP³C with pulse insertion.

The controller 20 comprises an observer module 22 that receives output currents $i_s$ of the converter 14 (input to the electrical motor 18). The stator currents $i_s$ may be measured at the output terminals of the converter 12. Typically, the observer module 22 also receives the DC-link voltage of the DC-link 16 and the switching signal u to reconstruct the voltage applied to the machine terminals. When available, the rotor speed $w_r$ from an optional encoder 23 may also be used by the observer module 22. Based on these quantities, the observer module 22 estimates an estimated stator flux vector $\psi_s$, an estimated rotor flux vector and an estimated torque $T_e$. A speed controller module 24 receives a difference between a reference speed $\omega_r^*$ and the rotor speed $w_r$ and determines a reference torque $T_e^*$ therefrom, which is an input to the torque controller module 26. The torque controller module 26 determines the (load) angle γ, which is the angle between the reference stator flux vector $\psi_s^*$ and the rotor flux vector. The angle of the reference stator flux vector is obtained by adding the load angle γ to the angle of the rotor flux vector. The flux reference controller module 28 derives the reference stator flux vector $\psi_s^*$, which lies on the optimal flux trajectory, and has the desired angle and the desired magnitude. The optimal flux trajectory is obtained by integrating an optimized pulse pattern P(m, d) that is generated by the flux controller module 30 and a pattern selector module 32 based on a modulation index m and a pulse number d, i.e. the number of switching events per quarter-period of the fundamental frequency. The stator flux error (vector) $\psi_{s,err}$ is computed from the difference between the reference stator flux vector $\psi_s^*$ and the estimated inverter flux vector $\psi_s$.

The stator flux error $\psi_{s,err}$ is input to an operation control module 34, comparing the (magnitude of) the stator flux error $\psi_{s,err}$ with an error band. In the case where the stator flux error $\psi_{s,err}$ is inside the error band, the operation control module 34 causes the pattern control module 36 to modify the time instants of the switching transitions of the optimized pulse pattern P(m, d) such that the stator flux error $\psi_{s,err}$ is minimized. Otherwise, the operation control module 34 causes the pattern control module 36 to insert an additional pulse into the optimized pulse pattern P(m, d) before the modification of the switching transitions, or it switches to another controller 38.

In the end, the pattern control module 36 or the other controller 38 generates a vector of switch positions u that is applied to the converter 12.

Figure 2:
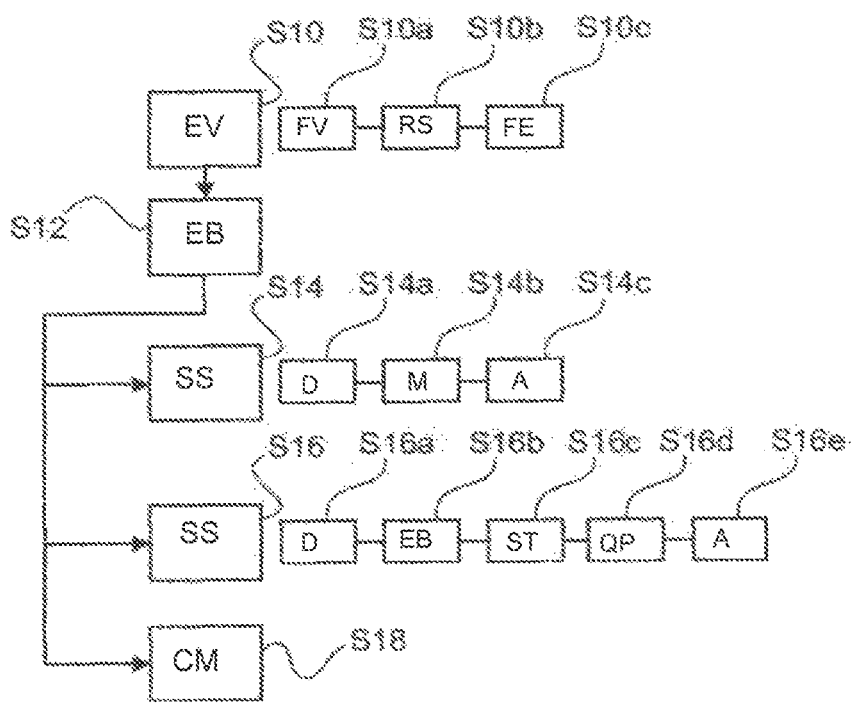
FIG. 2 shows a flow diagram for a method for controlling an electrical converter according to an embodiment of the invention.

The operation of the controller 20 will be explained in more detail in FIG. 2, which shows a method that may be performed by the controller 20.

In the following, normalized quantities are used and it is focused on a three-phase inverter 12 connected to an electrical machine 18. However, it has to be understood that the following embodiments also may be applied to an inverter connected to a general p-phase load or to a grid-connected converter connected to a power grid. Additional passive elements, such as filters, transformers and/or cables may be added.

Furthermore, in the following it is focused on fluxes for calculating the error value. It has to be understood that the estimated flux vector may be replaced with an estimated current vector and the reference flux vector may be replaced with a reference current vector to achieve the same or similar results.

All variables $\xi_{abc}=[\xi_a \xi_b \xi_c]^T$ in the three-phase system (abc) are transformed to $\xi_{\alpha\beta}=[\xi_\alpha \xi_\beta]^T$ in the stationary orthogonal αβ coordinates through $\xi_{\alpha\beta}=P\xi_{abc}$ with $$P = \frac{2}{3}\begin{bmatrix} 1 & -\frac{1}{2} & -\frac{1}{2} \\ 0 & \frac{\sqrt{3}}{2} & -\frac{\sqrt{3}}{2} \end{bmatrix}, P^{-1} = \begin{bmatrix} 1 & 0 \\ -\frac{1}{2} & \frac{\sqrt{3}}{2} \\ -\frac{1}{2} & -\frac{\sqrt{3}}{2} \end{bmatrix}. \tag{1}$$

$P^1$ denotes the pseudo-inverse of P.

$\psi_s=[\psi_{s\alpha} \psi_{s\beta}]^T$ is used to denote the stator flux vector, which is to be controlled by the controller 20. The converter 12 may be a three-phase voltage source inverter 12 with n voltage levels and a total DC-link voltage $v_{dc}$. For example, for a five-level inverter with n=5, the inverter 12 produces at each phase the n voltage levels $$\left\{-\frac{v_{dc}}{2}, -\frac{v_{dc}}{4}, 0, \frac{v_{dc}}{4}, \frac{v_{dc}}{2}\right\}.$$

These voltages may be described by the integer variables $u_x \in \{-2,-1,0,1,2\}$ with $x \in \{a,b,c\}$ denoting one of the three phases.

The three-phase switch position may be defined as $u_{abc} = [u_a\ u_b\ u_c]^T$. For simplification, often the indices of the three-phase system abc may be dropped from $u_{abc}$ and $\psi_{s,abc}$, simply writing u and $\psi_s$ instead.

$t_0 = kT_s$ is used to denote the current time instant, where k is the current time step and $T_s$ is the sampling interval. Note that to is real valued, while k is a natural number. Assume that the switch position in phase x changes at time t, i.e. $\Delta u_x(t) = u_x(t) - u_x(t-dt)$, with dt being an infinitesimally small time step, is nonzero. $\Delta u_x(t)$ may be seen as a single-phase switching transition. Three-phase switching transitions may be defined accordingly as $\Delta u(t) = u(t) - u(t-dt)$.

Error Determination

Returning to FIG. 2, in step S10, the controller 20 determines an error value (such as $\psi_{s,err}$ or the magnitude thereof) based on a difference between an estimated output value (such as $\psi_s$) and a reference output value (such as $\psi_s^*$). The estimated output value $\psi_s^*$ may be based on measurements (such as is) in the electrical converter 12, for example provided to the observer module 22.

For example, an algorithm performed by the controller 20 may operate in a discrete time domain and/or may be activated at equally spaced time instants $kT_s$, with $k \in N$ being the discrete time step and $T_s$ denoting the sampling interval. The control problem may be formulated and/or solved in stationary orthogonal coordinates. As already said, the angular electrical stator and rotor frequencies/speeds of the machine may be $\psi_s$ and $\omega_r$, respectively.

Figure 3:
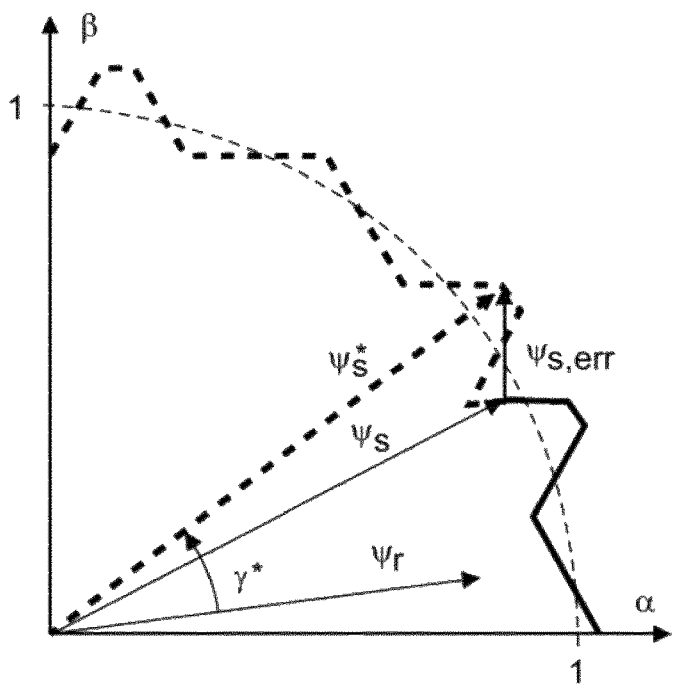
FIG. 3 shows a diagram illustrating the determination of an error value for the method of FIG. 2.

As an example, the stator flux error $\psi_{s,err}$ may be determined by the following sub-steps with reference to FIG. 3. FIG. 3 shows the vectors used in the following in the stationary orthogonal $\alpha\beta$ frame.

In sub-step S10a, the stator and rotor flux vectors in the stationary reference frame are estimated. This yields $\psi_s = [\psi_{s\alpha}\ \psi_{s\beta}]^T$ and $\psi_r = [\psi_{r\alpha}\ \psi_{r\beta}]^T$. Let $\angle\psi$ denote the angular position of a flux vector and its magnitude. The delay introduced by the computation time of the controller 20 may be compensated by rotating the estimated stator and rotor flux vectors by $\psi_s T_s$ forward in time, i.e. $\angle\psi_s = \angle\psi_s + \psi_s T_s$ and accordingly for the rotor flux.

In sub-step S10b, the reference stator flux vector $v_s$ is determined. The electromagnetic torque $T_e$ produced by the electrical machine 18 may be written as $T_e = k_r |\psi_s||\psi_r|\sin(\gamma)$, where $k_r$ is the rotor coupling factor, and $\gamma$ is the angle between the stator and the rotor flux vectors. When the electrical machine 18 is fully magnetized, the magnitude of the reference flux vector is equal to 1 pu. Then, for a given value of the rotor flux magnitude and a given torque reference, the desired angle between the stator and rotor flux vectors is $$\gamma^* = \sin^{-1}\left(\frac{T_e^*}{k_r|\psi_r|}\right). \tag{2}$$

The reference flux vector is then obtained by integrating the chosen nominal three-phase pulse pattern over time; the reference angle $\angle\psi_r + \gamma^*$ constitutes the upper limit of the integral. The resulting instantaneous reference flux vector has, in general, a magnitude and angle that slightly differ from their respective values on the unitary circle, FIG. 3. The vector diagram in this figure provides a graphical summary of the derivation of the reference flux vector.

In sub-step S10c, the stator flux error $\psi_{s,err}$ is determined, which is the difference between the reference and the estimated stator flux vector $$\psi_{s,err} = \psi_s^* - \psi_s. \tag{3}$$

In step S12, the error value (such as $\psi_{s,err}$ or its magnitude) is compared with an error band. For example, the error band may comprise an (offline) preset value and/or may be a central error band of several nested error bands as will be explained with reference to FIGS. 7 and 8.

In the case where the error value $\psi_{s,err}$ is within the error band, the electrical converter 12 is controlled with a modified pre-calculated switching sequence in step S14, wherein the modified pre-calculated switching sequence may be determined according to an MP³C algorithm without pulse insertion.

Otherwise, in the case where the error value $\psi_{s,err}$ is outside the error band, the electrical converter 12 is controlled by switching to a different control scheme; for example with the aid of pulse insertion into a pre-calculated switching sequence in step S16 or with switching to another control method in step S18.

Calculation of Modified Switching Sequences

The control with a modified pre-calculated switching sequence in step S14 may be performed in the following sub-steps:

In step S14a, a pre-calculated switching sequence 40 for the converter 12 based on an actual state of the electrical converter 12 is determined. For example, the actual state may comprise the stator currents $i_s$, the rotor speed $w_r$, the estimated stator flux vector $\psi_s$, the estimated rotor flux vector $\psi_r$ and/or the estimated torque $T_e$. Furthermore, the pre-calculated switching sequence may be based on reference values/vectors (that may be provided by an outer control loop) such as the reference speed $\psi_r^*$, the reference stator flux vector $\psi_s^*$ and/or the reference torque $T_e^*$.

Figure 4:
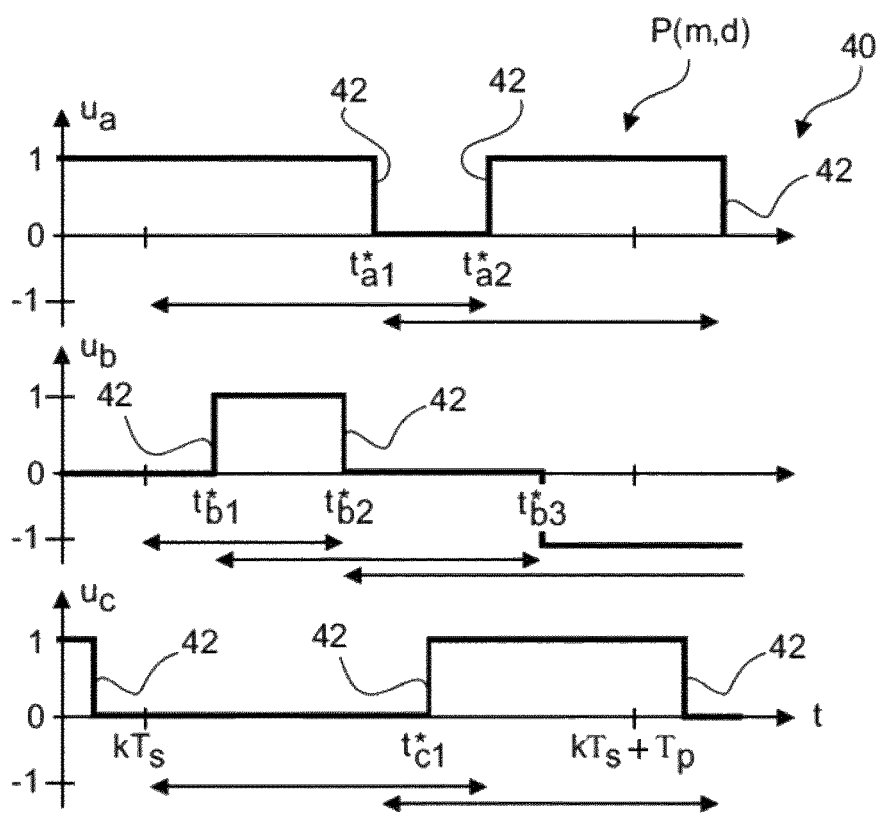
FIG. 4 shows a diagram illustrating the movement of switching transitions performed during the method of FIG. 2.

For example, the pre-calculated switching sequence 40 may be based on an optimized pulse pattern P(m, d) as shown in FIG. 4. For every phase a, b, c, the switching sequence 40 comprises a sequence of switching transitions 42 over time t.

In sub-step S14b, the pre-calculated switching sequence 40 is modified by moving transition times/switching instants of the switching transitions 42 in time such that the error value is minimized. The control problem may be formulated as an optimization problem with a quadratic objective/cost function and linear constraints, a so called quadratic program (OP).

The objective function may penalize the uncorrected error value such as the uncorrected flux error (the controlled variable) and optionally the changes of the switching instants (the manipulated variable). For example, a diagonal weight matrix Q may be used, whose components may be very small. Specifically, the QP may be formulated as $$\min_{\Delta t}\underbrace{(\|\psi_{s,err}-\psi_{s,corr}(\Delta t)\|_2^2+\Delta t^T Q \Delta t)}_{J(\Delta t)} \tag{4a}$$

subject to $$kT_s \leq t_{a1} \leq t_{a2} \leq \ldots \leq t_{an_a} \leq t_{a(n_a+1)}^* \tag{4b}$$

$$kT_s \leq t_{b1} \leq t_{b2} \leq \ldots \leq t_{bn_b} \leq t_{b(n_b+1)}^* \tag{4c}$$

$$kT_s \leq t_{c1} \leq t_{c2} \leq \ldots \leq t_{cn_c} \leq t_{c(n_c+1)}^*. \tag{4d}$$

As defined before, $\psi_{s,err}$ is the stator flux error in stationary coordinates $\alpha\beta$ and $\psi_{s,corr}(\Delta t)$ is the correction of the stator flux. The corrections of switching instants are aggregated in the vector $$\Delta t = [\Delta t_{a1} \Delta t_{a2} \ldots \Delta t_{an_a} \Delta t_{b1} \ldots \Delta t_{bn_b} \Delta t_{c1} \ldots \Delta t_{cn_c}]^T. \quad (5)$$

For phase a, for example, the correction of the i-th transition time is given by $\Delta t_{ai} = t_{ai} - t_{ai}^*$, where $t_{ai}^*$ denotes the nominal switching instant of the i-th transition $\Delta u_{ai}$. Again, the latter is defined as $\Delta u_{ai} = u_a(t_{ai}^*) - u_a(t_{ai}^* - dt)$ with dt being an infinitesimally small time step. Moreover, $n_a$ denotes the number of switching transitions in phase a that are within the prediction horizon, and $t_{a(n_a+1)}^*$ refers to the first nominal switching transition beyond the horizon. The quantities for phases b and c are defined accordingly.

Usually, the switching instants cannot be modified arbitrarily. For the three phases, the set of constraints (4b)-(4d) is imposed, which constrains the switching instants in two ways. First, by the current time instant $kT_s$, i.e. transitions cannot be moved into the past. Second, by the neighbouring switching transitions in the same phase, ensuring that the correct sequence of switching transitions is kept.

FIG. 4 provides an example to illustrate this. The first switching transition in phase b, for example, is constrained to lie between $kT_s$ and the nominal switching instant of the second transition in phase b, $t_{b2}^*$. The second switching transition in phase b can only be delayed up to the nominal switching instant of the third transition in the same phase, $t_{b3}^*$. In this example, the number of transitions that fall within the prediction horizon $T_p$ are $n_a=2$, $n_b=3$ and $n_c=1$. Note that the transitions in a given phase are modified independently from those in the other phases.

The horizon length $T_p$ is a design parameter. If required, $T_p$ is increased so as to ensure that switching transitions in at least two phases fall within the horizon. In case $T_p$ is smaller than $t_{a1}^* - kT_s$, it is increased to this value.

In sub-step S14c, the modified switching sequence 40 is applied to the electrical converter 12.

Firstly, the switching transitions 42 are removed from the OP that will occur within the sampling interval. This can be accomplished by updating a pointer to the look-up table that stores the switching angles of the optimized pulse pattern and the respective three-phase potential values.

Secondly, the switching commands over the sampling interval are derived, i.e. the switching instants and the associated switch positions. The switching commands are sent to the gate units of the semiconductor switches 14 in the converter 12.

Pulse Insertion

Figure 5:
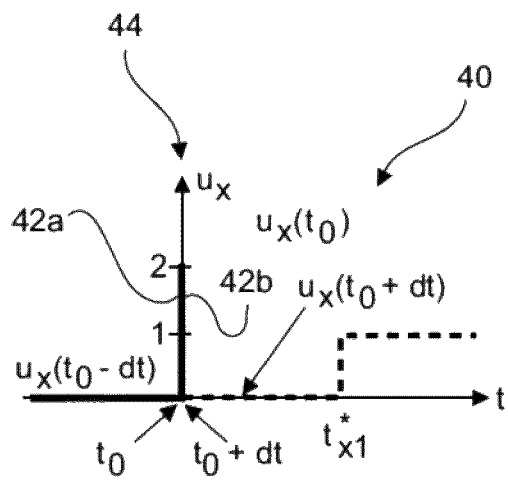
FIG. 5 shows a diagram with an additional pulse inserted into a switching sequence in the method of FIG. 2.
Figure 6:
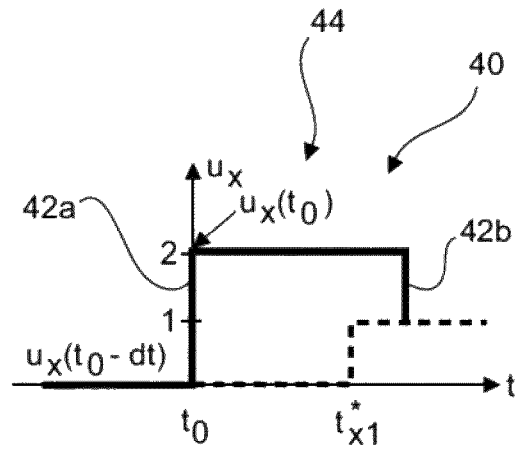
FIG. 6 shows a diagram with the additional pulse of FIG. 5 being extended by the method of FIG. 2.

The modifications with respect to step S14, which result in step S16, are explained with respect to FIGS. 5 and 6. FIGS. 5 and 6 shows diagrams similar to one phase of FIG. 4 with the beginning of a switching sequence 40. In the switching sequence 40, two switching transitions 42a and 42b are inserted. The switching transitions 42a, 42b are inserted at the start of the switching sequence 40 and at the same time instant. The two switching transitions 42a, 42b may be interpreted as an additional pulse 44 with zero width.

After that the switching sequence 40 may be modified according to step S14 (which will be explained in more detail below), which may result in an additional switching pulse 44 of nonzero length (see FIG. 6).

In general, a switching pulse 44 may consist of or may comprise two consecutive switching transitions 42a, 42b in the same phase. The two switching transitions 42a, 42b of a switching pulse may have opposite signs but do not necessarily have the same magnitude. In general, a pulse 44 may comprise switching transitions in more than one phase.

The insertion of additional pulses is described in the following in a form, which extends the algorithm of step S14.

In sub-step S16a, according to sub-step S14a, a pre-calculated switching sequence 40 is determined.

In substep S16b, an error band associated with the error value is determined and a voltage level of the inserted switching pulse 44 is determined based on the determined error band.

Preliminarily, note that in step S10 the stator flux error is calculated at time-instant to, which is the difference between the reference and the estimated stator flux vector according to $$\psi_{s,err,\alpha\beta}(t_0) = \psi_{s,\alpha\beta}^*(t_0) - \psi_{s,\alpha\beta}(t_0). \quad (6)$$

The stator flux error is mapped from the orthogonal $\alpha\beta$ coordinate system into the three-phase system $$\psi_{s,err,abc}(t_0) = P^{-1} \psi_{s,err,\alpha\beta}(t_0). \quad (7)$$

Figure 7:
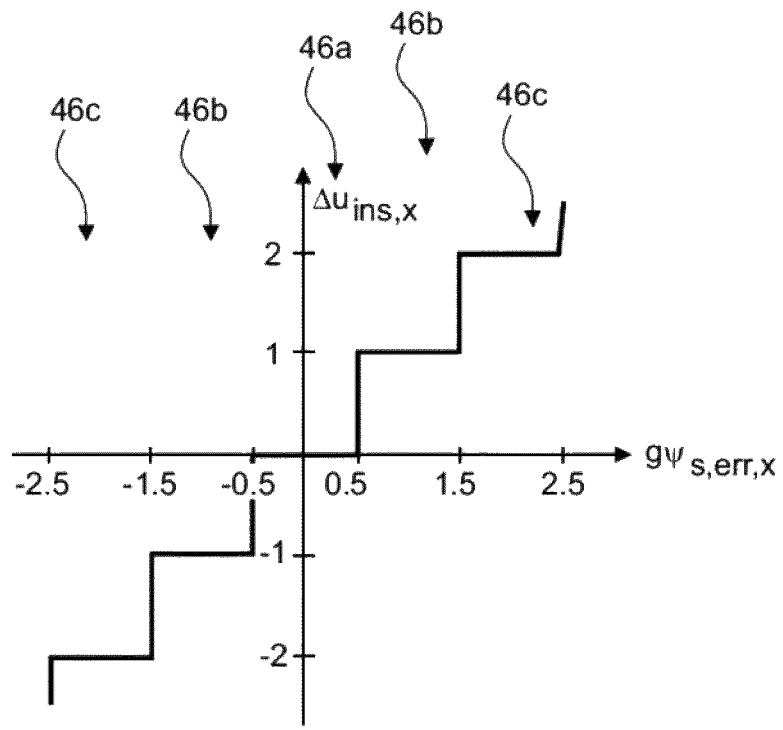
FIG. 7 shows a diagram with error bands used in the method of FIG. 2.

As shown in FIG. 7, in each phase error bands 46a, 46b, 46c are introduced on the stator flux error $\psi_{s,err}$. When the stator flux error $\psi_{s,err}$ lies with the central error band 46a, no additional pulse 44 is inserted. When the stator flux error $\psi_{s,err}$ lies within the first error band 46b, a pulse 44 of voltage level 1 is inserted. When the stator flux error $\psi_{s,err}$ lies with the second error band 46c, a pulse 44 of voltage level 2 is inserted.

As shown in FIG. 7, the magnitude and sign of the flux error in abc determines the magnitude and sign of the additional switching transition $\Delta u_{ins,abc}$. This is done for each phase separately. If the switching transition is zero in all three phases, i.e. when $|g\psi_{s,err,x}| < 0.5$, with $x \in \{a,b,c\}$, then no pulse is inserted.

In general, the transitions' magnitudes and signs in the three phases are determined based on the error bands 46a, 46b, 46c. This may be expressed in a compact way by $$\Delta u_{ins,abc}(t_0) = \text{round}(g \psi_{s,err,abc}(t_0)), \quad (8)$$

where the gain g is a user-defined scalar parameter.

The gain and rounding operation implicitly define the error bounds. Note also that since the stator flux vector is the integral of the inverter switch positions weighted with half the total DC-link voltage, i.e.

$$\psi_{s,abc}(t) = \psi_{s,abc}(0) + \frac{v_{dc}}{2} \int_0^t u_{abc}(\tau) d\tau,$$

the term $$\frac{v_{dc}}{2}$$

is implicitly included in the gain g.

When the flux error is positive, which may be caused by too small a stator flux, additional volt-second is to be added, which is equivalent to adding a positive switching transition 42a and hence a positive pulse 44.

Specifically, an additional switching transition of magnitude 1 is required in phase x, $\Delta u_{ins,x} = 1$, if $0.5 \le g\psi_{s,err,x} < 1.5$. Correspondingly, a transition of magnitude $\Delta u_{ins,x} = 2$ is added in case $1.5 \le g\psi_{s,err,x} < 2.5$, and so on. Negative switching transitions are added in the presence of negative flux errors.

In the optional sub-step S16, it is ensured that short pulses 44 are not added repeatedly, which may give rise to a chattering phenomenon and an increase in the switching frequency. This issue may be avoided by ensuring that, when switching transitions 42a, 42b are inserted, the magnitude of the inserted transitions 42a, 42b decreases in each phase while maintaining its sign. Specifically, for each phase, the required additional transition is modified when required, according to the following three rules:

1. If $|\Delta u_{ins}(k-1)|>0$ and $\Delta u_{ins,x}(k-1)=0$ then $\Delta u_{ins,x}(k)=0$.
2. If $\Delta u_{ins,x}(k-1)>0$ then $\Delta u_{ins,x}(k)=\min(\max(\Delta u_{ins,x}(k), 0), \Delta u_{ins,x}(k-1))$.
3. If $\Delta u_{ins,x}(k-1)>0$ then $\Delta u_{ins,x}(k)=\min(\max(\Delta u_{ins,x}(k), 0), \Delta u_{ins,x}(k-1))$.

The first rule ensures that when a pulse insertion campaign has ended in phase x but is still ongoing in at least one other phase, it is not restarted in phase x, before it has ended in all three phases. The second and third rules impose that the magnitudes of the inserted switching transitions decrease monotonically until they reach zero.

In sub-step S16d, the additional switching transition $\Delta u_{ins}$ is inserted into the switching sequence (40) determined in step S16a (i.e. the nominal switch positions and the nominal transition times).

In particular, a nominal OPP P(m, d) may be read from a look-up table. The nominal (unmodified) switching sequence 40 may be built starting at time instant $t_0$ sufficiently far into the future. A nominal switching sequence 40 in phase x is shown as the dotted line in FIG. 5.

After that, the value of the switch position at time to is determined, which is given by $u(t_0)=u(t_0-dt)+\Delta u_{ins}(t_0)$. In here, the switch position currently applied to the converter 12 is denoted by $u(t_0-dt)$. In case $u(t_0)$ exceeds the set of available switch positions of the inverter, $u(t_0)$ is saturated at the maximal and minimal attainable switch positions, respectively. This may imply that it might not be possible to implement the inserted switching transition to the full extent requested. As an example, consider a five-level inverter. Assume that the currently applied switch position in phase x is $u_x(t_0-dt)=1$ and that the additional switching transition $\Delta u_x(t_0)=3$ has been requested. Only $u_x(t_0)=2$ can be implemented, corresponding to an inserted transition of $\Delta u_x(t_0)=1$ in phase x.

In the end, a pulse 44 with the infinitesimally small width dt is added, by adding a switching transition 42a at time $t_0$ from $u(t_0-dt)$ to $u(t_0)$ and another switching transition 42b with opposite sign at time $t_0+dt$ from $u(t_0)$ to $u(t_0+dt)$. Special care may need to be taken to ensure that the magnitude of the second switching transitions (at time $t_0+dt$) is correct, since the first and second switching transitions do not necessarily sum up to zero. This is the case, for example, when a nominal switching transition is scheduled at $t_0$. The switch position $u(t_0+dt)$ may have to match the nominal switch position at time $t_0+dt$.

The pulse 44 starts at time instant to and ends at to +dt. The volt-seconds of the inserted pulse 44 are thus effectively zero. The added pulse 44 is shown as a straight line in FIG. 5.

The resulting switching sequence 40 comprises the unmodified switching transitions 42 given by the OPP P(m, d) and an additional pulse 44 at time to of width dt.

In sub-step S16d, analogously to step S14b, the pulse pattern controller module 36 is executed, by formulating and solving the quadratic program (QP), as stated in (4). Alternatively, an MP³C variation based on a deadbeat controller may be formulated and solved.

The pattern controller module 36 modifies the switching transitions 42a, 42b, 42 of the switching sequence 40 starting at time $t_0$, which, in general, may include additional pulses 44. The transition times of the pulses 44 are shifted to remove any flux error.

As such, the pulse insertion concept proposed above relies on closed-loop control and provides the controller 20, when required, with additional degrees of freedom to correct the flux error $\psi_{s,err}$. The inserted pulse 44 has effectively zero volt-seconds, thus resembling a virtual pulse. The width of the pulse 44 is set by the pattern controller in a closed-loop fashion. This implies that the width of the pulse 44 may be readjusted at subsequent sampling instants, in case additional disturbances affect the flux or when the flux reference changes. By modifying the transition times of the pulse 44, the volt-second correction required to drive the stator flux vector back to its reference as quickly as possible is achieved by MP³C.

In sub-step S16e, accordingly to sub-step S14c, the modified switching sequence 40 is applied to the converter 20.

Switching to Another Control Method

An alternative or addition to the pulse insertion method in step S16 is to temporarily switch to a different type of control method in step S18, when the system 10 is operated under dynamic conditions.

For example, when the error value is outside a first error band, step S16 may be executed, and when the error value is outside a wider second error band, step S18 may be executed.

The pulse insertion method (step S16) may refer to the use of OPPs. These do not always allow to quickly switch to the voltage vector that minimizes the flux error. It may be required to wait for a relatively long time interval for the next switching instant to occur, depending on the operating point. The reason may be the non-uniform distribution of the switching instants over the fundamental period of the voltage waveform.

Other than this, some conventional control methods allow selecting the voltage vector that minimizes the flux error without having to wait longer than the occurrence of the next sampling interval. Typical examples of such fast closed-loop control methods include hysteresis-based flux control method, such as direct torque control, model predictive direct torque control, direct self control and sliding mode control.

Fast control method may be enabled as an alternative (or addition) to implementing and using the proposed pulse insertion method. This fast control method can be enabled automatically if the flux error magnitude exceeds a preset error band. Below this value, OPPs and MP³C can be used to ensure minimum harmonic distortions of the current waveform and the elimination of relatively small flux errors in quasi steady-state operation. Pulse insertion may still be advantageous to quickly remove such small flux errors.

Other Embodiments

The error bands 46a, 46b, 46c on the error value such as the flux error $\psi_{s,err}$ may be defined in various ways, including the following.

The error band 46a may have different values, for example from −1 to 1, rather than from −0.5 to 0.5.

The error band 46a may be wider than the error bands 46b and 46c. Rather than using error bands 46a, 46b, 46c of constant widths, error bands 46a, 46b, 46c with different widths can be adopted. As an example, a wide error band 46b may be used for small flux errors, but for larger errors, the error band 46c is tightened. As a result, pulse insertion may be used cautiously for small errors, but more aggressively for large flux errors.

Figure 8:
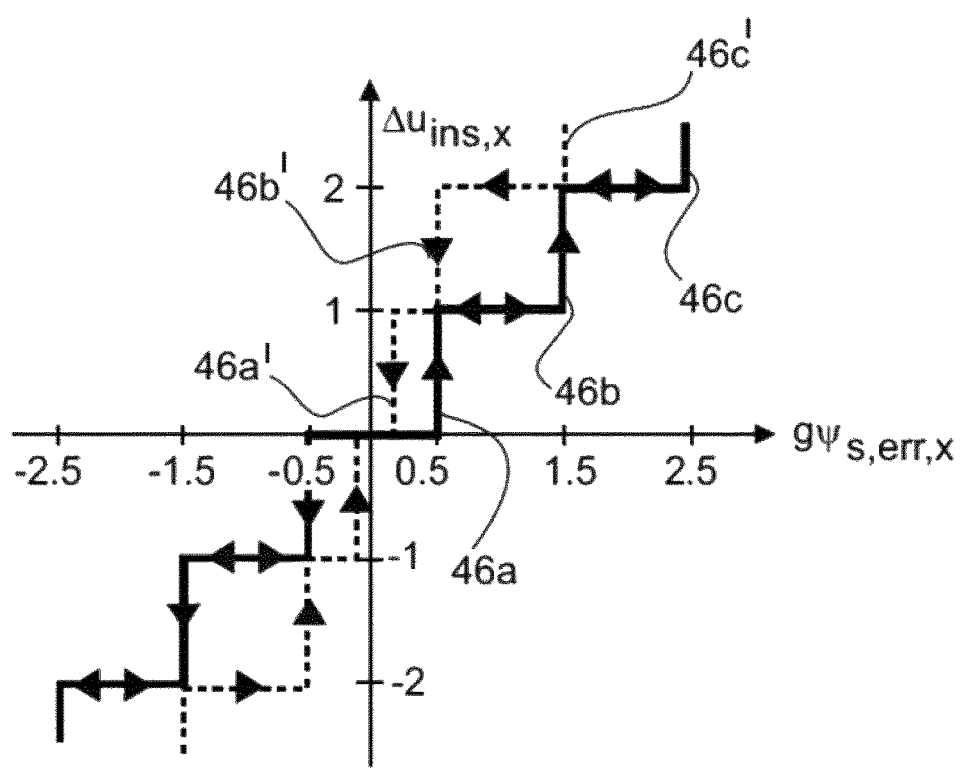
FIG. 8 shows a diagram with error bands subjected to hysteresis used in the method of FIG. 2.

As shown in FIG. 8, error bands with a hysteresis on the magnitude of the pulse 44 to be inserted may be introduced. When the error value is decreasing over time, other (smaller) error bands 46a', 46b', 46c' may be used as in the case when the error value is increasing.

Furthermore, another controlled vector may be used. So far, the focus was on an inverter 12 directly connected to an electrical machine 18, in which the stator flux vector is controlled. Neglecting the stator resistance, the stator flux vector may be equivalent to the integral of the inverter output voltage over time. We refer to this voltage integral as the virtual inverter flux vector.

This allows us to apply the control method to any converter system, by controlling the (virtual) converter flux $\psi$. Specifically, when an LC filter and/or a long cable is inserted between the inverter 12 and the machine 18, $\psi$ is the so-called virtual inverter flux vector. Correspondingly, in a grid-connected converter setting, denotes the virtual converter flux vector. In such settings, the computation of the reference angle of $\psi$ needs to be modified and (2) is to be replaced accordingly.

Alternatively, instead of controlling the (virtual) flux vector, a current vector may be controlled, similar to the literature on trajectory tracking. It is also conceivable to control other vectors.

The functional modules may be implemented as programmed software modules or procedures, respectively; however, one skilled in the art will understand that the functional modules may be implemented fully or partially in hardware.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 electrical system
12 electrical converter
14 semiconductor switches
16 DC link
18 electrical motor or machine
20 controller
22 observer module
23 encoder
24 speed controller module
26 torque controller module
28 flux reference controller module
30 flux controller module
32 pattern selector module
34 operation control module
36 pattern control module
38 different controller
$i_s$ stator currents
$w_r$ rotor speed
$\omega_r^*$ reference speed
$\psi_s$ estimated stator flux vector
$\psi_s^*$ reference stator flux vector
$\psi_r$ estimated rotor flux vector
$T_e$ estimated torque
$T_e^*$ reference torque
P(m, d) optimized pulse pattern
$\psi_{s,err}$ stator flux error
u three-phase switch positions
40 switching sequence
42 switching transition
t time
$u_a$ switch position in phase a
$u_b$ switch position in phase b
$u_c$ switch position in phase c
$T_p$ horizon
42a additional switching transition
42b additional switching transition
44 pulse
46a central error band
46b second error band
46c third error band
46a' central error band for hysteresis
46b' second error band for hysteresis
46c' third error band for hysteresis

The invention claimed is:

1. A method for controlling an electrical converter, the method comprising:
  determining an error value based on a difference between an estimated output value and a reference output value, the estimated output value being based on measurements in the electrical converter;
  comparing the error value with an error band and in the case of the error value being within the error band, controlling the electrical converter with a modified pre-calculated switching sequence by:
  determining a pre-calculated switching sequence for the converter based on an actual state of the electrical converter, the switching sequence comprising a sequence of switching transitions of the converter;
  modifying the pre-calculated switching sequence by modifying transition times of switching transitions of the pre-calculated switching sequence, such that the error value is minimized;
  applying at least a part of the modified switching sequence to the electrical converter;
  in the case where the error value exceeds the error band, controlling the electrical converter by switching to a different control scheme;
  whereby the different control scheme is based on inserting an additional switching transition into the pre-calculated switching sequence before the pre-calculated switching sequence is modified and the additional switching transition generate an additional pulse with an infinitesimal small width;
  selecting an error band associated with the error value from a plurality of error bands, whereby a voltage level of the inserted switching transition is dependent on the determined error band and a selection of an error band is based on past error values.

2. The method of claim 1,
wherein the error bands have different widths.

3. The method of claim 1,
wherein the error value is one of a flux error based on a difference between an estimated flux vector and a reference flux vector; and
a current error based on a difference between an estimated current and a reference current.

4. The method of claim 1,
wherein the error value is minimized subject to the constraint that an order of switching transitions of the pre-calculated switching sequence is not modified.

5. The method of claim 1,
wherein the modified switching sequence is determined by solving a quadratic problem with a cost function based on the error value.

6. The method of claim 1,
wherein the error value is minimized within a prediction horizon that encompasses at least two switching transitions in two phases.

7. A non-transitory computer-readable medium configured with instructions executable by a computer to control an electrical converter to:
determine an error value based on a difference between an estimated output value and a reference output value, the estimated output value being based on measurements in the electrical converter;
compare the error value with an error band and in the case of the error value being within the error band, controlling the electrical converter with a modified pre-calculated switching sequence by:
determining a pre-calculated switching sequence for the converter based on an actual state of the electrical converter, the switching sequence comprising a sequence of switching transitions of the converter,
modifying the pre-calculated switching sequence by modifying transition times of switching transitions of the pre-calculated switching sequence, such that the error value is minimized,
applying at least a part of the modified switching sequence to the electrical converter, and
in the case where the error value exceeds the error band, controlling the electrical converter by switching to a different control scheme, wherein the different control scheme is based on inserting an additional switching transition into the pre-calculated switching sequence before the pre-calculated switching sequence is modified and the additional switching transition generate an additional pulse with an infinitesimal small width; and
select an error band associated with the error value from a plurality of error bands, whereby a voltage level of the inserted switching transition is dependent on the determined error band and a selection of an error band is based on past error values.

8. The non-transitory computer-readable medium of claim 7, wherein the different control scheme is another control method.

9. The non-transitory computer-readable medium of claim 7, wherein the error bands have different widths.

10. The non-transitory computer-readable medium of claim 9,
wherein the error value is a flux error based on a difference between an estimated flux vector and a reference flux vector; or
wherein the error value is a current error based on a difference between an estimated current and a reference current.

11. The non-transitory computer-readable medium of claim 9,
wherein the error value is minimized subject to the constraint that an order of switching transitions of the pre-calculated switching sequence is not modified.

12. The non-transitory computer-readable medium of claim 9,
wherein the modified switching sequence is determined by solving a quadratic problem with a cost function based on the error value.

13. The non-transitory computer-readable medium of claim 9,
wherein the error value is minimized within a prediction horizon that encompasses at least two switching transitions in two phases.

14. An electrical converter, comprising:
a plurality of semiconductor switches; and
a controller adapted for controlling the semiconductor switches;
wherein the controller is structured to execute instructions stored in a non-transitory computer readable medium to control the converter to:
determine an error value based on a difference between an estimated output value and a reference output value, the estimated output value being based on measurements in the electrical converter;
compare the error value with an error band and in the case of the error value being within the error band, controlling the electrical converter with a modified pre-calculated switching sequence by:
determining a pre-calculated switching sequence for the converter based on an actual state of the electrical converter, the switching sequence comprising a sequence of switching transitions of the converter,
modifying the pre-calculated switching sequence by modifying transition times of switching transitions of the pre-calculated switching sequence, such that the error value is minimized,
applying at least a part of the modified switching sequence to the electrical converter, and
in the case where the error value exceeds the error band, controlling the electrical converter by switching to a different control scheme, wherein the different control scheme is based on inserting an additional switching transition into the pre-calculated switching sequence before the pre-calculated switching sequence is modified and the additional switching transition generate an additional pulse with an infinitesimal small width; and
select an error band associated with the error value from a plurality of error bands, whereby a voltage level of the inserted switching transition is dependent on the determined error band and a selection of an error band is based on past error values.

15. The electrical converter of claim 14, wherein the error bands have different widths.

16. The electrical converter of claim 14,
wherein the error value is a flux error based on a difference between an estimated flux vector and a reference flux vector; or
wherein the error value is a current error based on a difference between an estimated current and a reference current.

17. The electrical converter of claim 14,
wherein the error value is minimized subject to the constraint that an order of switching transitions of the pre-calculated switching sequence is not modified.

18. The electrical converter of claim 14, wherein the modified switching sequence is determined by solving a quadratic problem with a cost function based on the error value.

19. The electrical converter of claim 14, wherein the error value is minimized within a prediction horizon that encompasses at least two switching transitions in two phases.

* * * * *